United States Patent
Torek et al.

(10) Patent No.: US 6,576,557 B1
(45) Date of Patent: Jun. 10, 2003

(54) SEMICONDUCTOR PROCESSING METHODS

(75) Inventors: Kevin J. Torek, Meridian, ID (US); Satish Bedge, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/140,580

(22) Filed: May 7, 2002

Related U.S. Application Data

(62) Division of application No. 10/057,578, filed on Jan. 25, 2002.

(51) Int. Cl.[7] .............................................. H01L 21/311
(52) U.S. Cl. ....................... 438/700; 438/789; 438/624; 438/636; 438/637; 438/738; 257/635; 257/639
(58) Field of Search ................................ 438/424, 789, 438/700, 444, 270, 259, 300–305, 624, 634, 636, 637, 737–738, 739; 257/330, 408, 635, 639

(56) References Cited

U.S. PATENT DOCUMENTS

| | | | | |
|---|---|---|---|---|
| 5,824,594 A | * | 10/1998 | Kim et al. .................. 438/439 |
| 5,960,312 A | * | 9/1999 | Morikawa ................... 438/533 |
| 6,025,273 A | * | 2/2000 | Chen et al. ................. 438/706 |
| 6,060,353 A | | 5/2000 | Koh |
| 6,096,629 A | * | 8/2000 | Tsai et al. ................... 438/570 |
| 6,124,211 A | * | 9/2000 | Butterbaugh et al. .......... 134/1 |
| 6,207,583 B1 | * | 3/2001 | Dunne et al. ................. 134/1.2 |
| 6,245,643 B1 | * | 6/2001 | King et al. .................. 438/439 |
| 6,265,319 B1 | * | 7/2001 | Jang ............................. 438/723 |
| 6,277,707 B1 | * | 8/2001 | Lee et al. ..................... 438/270 |
| 6,297,163 B1 | * | 10/2001 | Zhu et al. .................... 438/707 |
| 6,303,513 B1 | * | 10/2001 | Khan et al. ............. 156/345.24 |
| 6,323,121 B1 | * | 11/2001 | Liu et al. ..................... 438/633 |
| 6,326,300 B1 | * | 12/2001 | Liu et al. ..................... 438/638 |
| 6,383,863 B1 | | 5/2002 | Chiang et al. |
| 6,402,974 B1 | * | 6/2002 | Trevor et al. .................. 216/64 |
| 6,406,640 B1 | | 6/2002 | Yang et al. |
| 6,407,002 B1 | * | 6/2002 | Lin et al. ..................... 438/713 |
| 6,410,424 B1 | | 6/2002 | Tsai et al. |
| 6,440,833 B1 | | 8/2002 | Lee et al. |
| 6,458,516 B1 | | 10/2002 | Ye et al. |
| 6,497,993 B1 | * | 12/2002 | Chiu et al. ................... 430/313 |
| 6,518,164 B1 | * | 2/2003 | Wu et al. ..................... 438/618 |
| 2001/0021567 A1 | * | 9/2001 | Takahashi .................... 438/424 |
| 2002/0132422 A1 | | 9/2002 | Ranade et al. |

* cited by examiner

*Primary Examiner*—Phat X. Cao
*Assistant Examiner*—Thao X. Le
(74) *Attorney, Agent, or Firm*—Wells St. John P.S.

(57) ABSTRACT

The invention includes a semiconductor processing method in which a semiconductor substrate is exposed to reactive ion etching conditions. The reactive ion etching conditions comprise subjecting exposed surfaces of the substrate to a gas having components therein which are reactive with the exposed surfaces. A total concentration of the reactive components within the gas is less than 4.5%, by volume. In particular aspects, the total concentration of the reactive components can be less than 2% by volume, or less than 1% by volume. Exemplary reactive components are fluorine-containing components, such as $NF_3$.

39 Claims, 2 Drawing Sheets

SEMICONDUCTOR PROCESSING METHODS

RELATED PATENT DATA

This patent resulted from a divisional application of U.S. patent application Ser. No. 10/057,578, which was filed on Jan. 25, 2002.

TECHNICAL FIELD

The invention pertains to semiconductor processing methods, and in particular applications pertains to reactive ion etching of semiconductor substrates utilizing low concentrations of reactive etching components.

BACKGROUND OF THE INVENTION

It is frequently desired during semiconductor processing to form openings in a material. Prior to, or during, the formation of the openings, a patterned mass (such as, for example, an antireflective coating), is frequently provided over the material. After the openings are etched into the material, it is frequently desired to remove the mass from over an upper surface of the material without extending a depth or width of the openings. This has proven difficult, and it would be desirable to develop improved methods for removing a mass from over an upper surface of a material.

SUMMARY OF THE INVENTION

In one aspect, the invention encompasses a semiconductor processing method in which a semiconductor substrate is exposed to reactive ion etching conditions. The reactive ion etching conditions comprise subjecting exposed surfaces of the substrate to a gas having components therein which are reactive with the exposed surfaces. A total concentration of the reactive components within the gas is less than 4.5%, by volume. In particular aspects, the total concentration of the reactive components can be less than 2% by volume, or less than 1% by volume. Exemplary reactive components are fluorine-containing components, such as $NF_3$.

In one aspect, a semiconductor substrate includes a first mass of material, a second mass over the first mass, and an opening extending through the first mass and into the second mass. The second mass has a thickness and the opening has a width. The substrate is subjected to etching conditions which remove at least 250 angstroms from the thickness of the second mass, and which extend the width of the opening by no more than 100 angstroms, in some aspects by no more than 50 angstroms; and in some aspects by no more than 10 angstroms. In further aspects, the etching conditions extend a depth of the opening by no more than 50 angstroms, and in some aspects by no more than 10 angstroms.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

In particular aspects the invention includes methods in which a biased-substrate plasma is utilized at relatively high pressures (at least 300 mTorr, and in some applications at least about 1000 mTorr) and low reactive gas concentrations (less than 4.5% by volume, more preferably less than 2% by volume, and even more preferably less than 1% by volume) to accomplish removal of a top layer of an integrated circuit construction without substantially affecting materials that are in exposed areas at the bottoms or sidewalls of high aspect ratio trenches or contacts.

In particular aspects, the invention takes advantage of an etch lag to accomplish desired selectivity of etching various surface features relative to one another.

An exemplary method of the present invention is described with reference to FIGS. 1–4.

Figure 1:
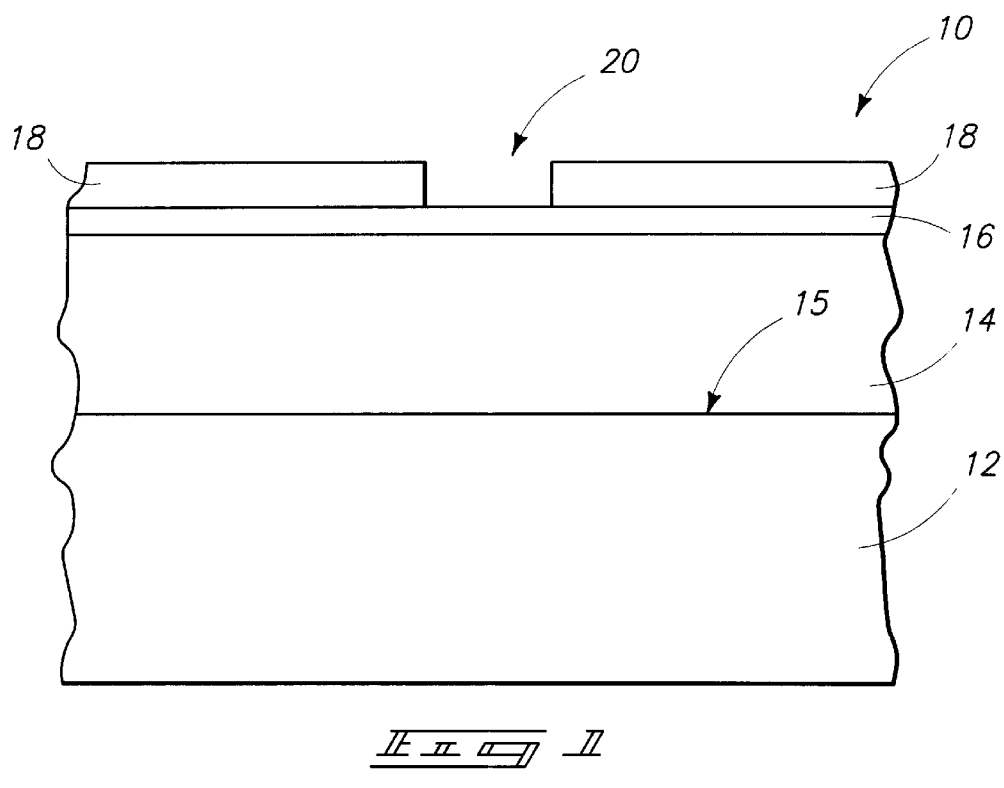
FIG. 1 is a diagrammatic, cross-sectional view of a semiconductor wafer fragment at a preliminary processing step of a method of the present invention.

Referring initially to FIG. 1, a fragment of a semiconductor wafer construction 10 is illustrated. Wafer construction 10 comprises a substrate 12, having an upper surface 15. Substrate 12 can comprise, for example, monocrystalline silicon. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An insulative material 14 is formed over substrate 12. Insulative material 14 can comprise, for example, borophosphosilicate glass (BPSG).

A mass 16 is formed over insulative material 14. Mass 16 can be an antireflective coating 16. Antireflective coating 16 can be, for example, a dielectric antireflective coating (DARC), and can comprise, for example, silicon oxynitride ($SiO_xN_y$, wherein x and y are greater than zero).

A patterned masking layer 18 is formed over antireflective coating 16. Masking layer 18 can comprise, for example, photoresist, and can be patterned utilizing photolithographic methods.

An opening 20 extends through patterned masking layer 18.

Figure 2:
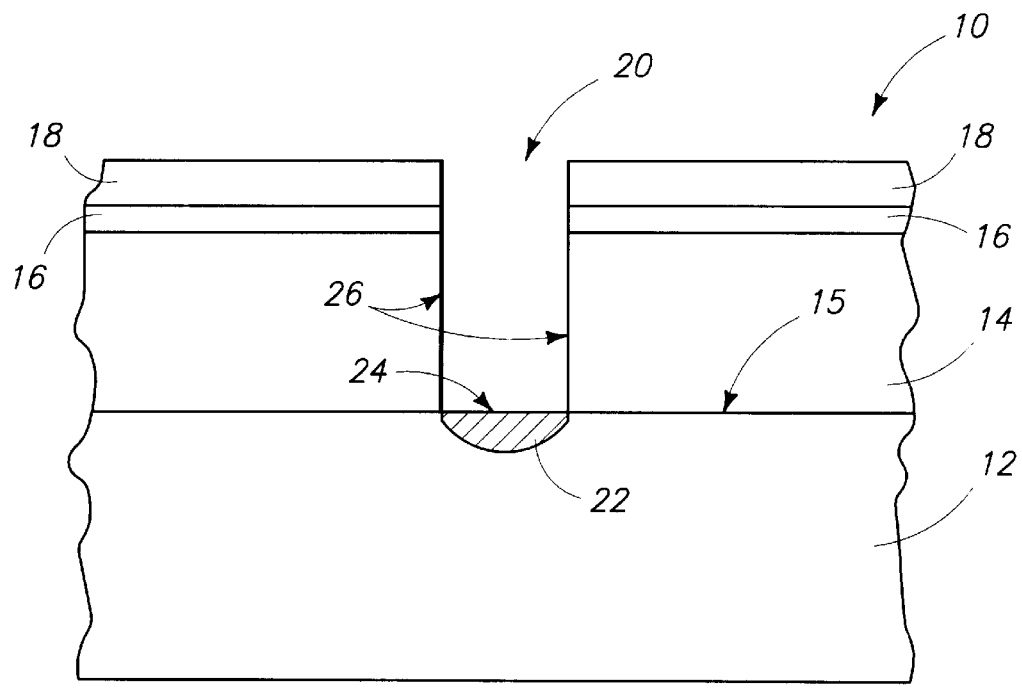
FIG. 2 is a view of the FIG. 1 wafer fragment shown at a processing step subsequent to that of FIG. 1.

Referring to FIG. 2, opening 20 is extended through antireflective coating layer 16 and insulative material 14, and to the upper surface 15 of substrate 12. Although opening 20 is shown extending entirely through insulative mass 14, it is to be understood that opening 20 can alternatively extend only partially into insulative mass 14. Also, it is to be understood that although opening 20 is shown terminating at upper surface 15 of substrate 12, the opening can also extend into substrate 12. In any event, opening 20 comprises a bottom periphery 24, and sidewall peripheries 26.

An electrical node 22 is provided within substrate 12 by implanting a conductivity-enhancing dopant through opening 20 and into the semiconductive material of substrate 12. Electrical node 22 can comprise either an n-type doped region or a p-type doped region.

It is to be understood that the methodology described with reference to FIGS. 1 and 2 for providing electrical node 22 at a base of opening 20 is but one exemplary method, and that other methods can be utilized. For instance, electrical node 22 can comprise a conductive plug formed over or within substrate 12 prior to formation of insulative material 14. Opening 20 can then be extended to an upper surface of the conductive plug. In such embodiments, the conductive plug can comprise one or more of conductively-doped silicon (such as polycrystalline silicon), metal, and metal silicide, for example.

Opening 20 will preferably be a high aspect ratio opening, and specifically will preferably will comprise an aspect ratio of at least 3, more preferably of at least 5, yet more preferably of at least 6, even more preferably of at least about 6.5, and yet more preferably of at least about 7. High aspect ratio openings are typically preferred in semiconductor processing applications over lower aspect ratio openings, in that higher aspect ratio openings consume a lower footprint of valuable semiconductor real estate than do lower aspect ratio openings.

Figure 3:
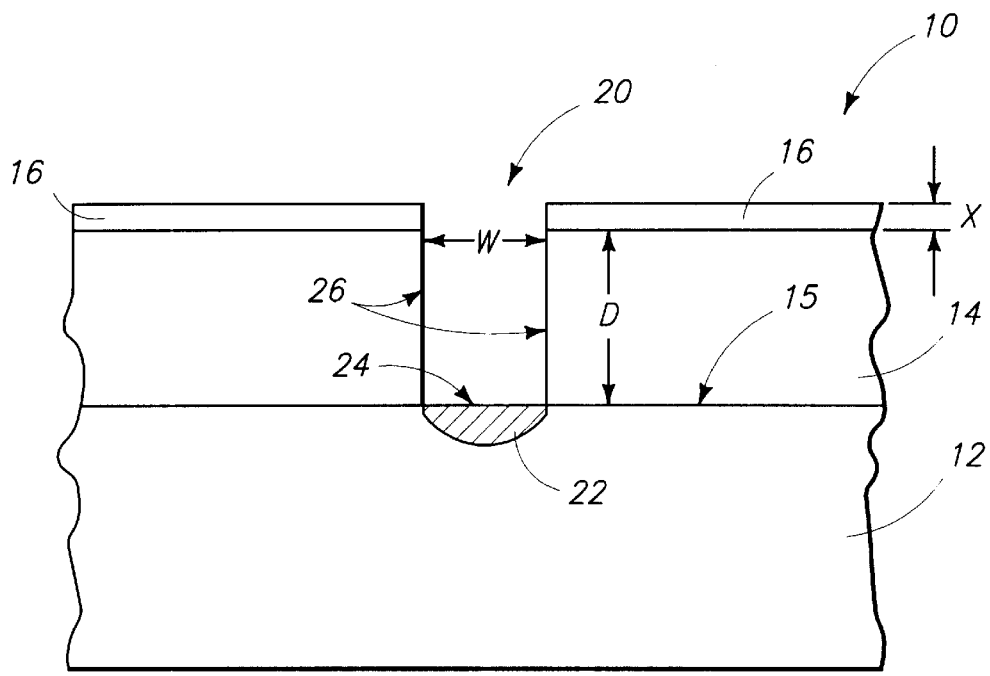
FIG. 3 is a view of the FIG. 1 wafer fragment shown at a processing step subsequent to that of FIG. 2.
Figure 4:
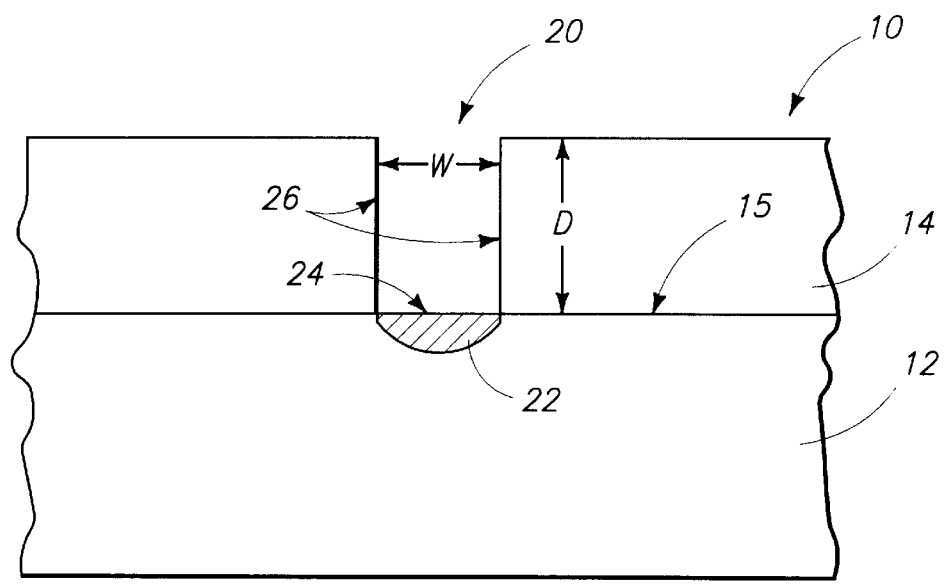
FIG. 4 is a view of the FIG. 1 wafer fragment shown at a processing step subsequent to that of FIG. 3.

Referring to FIG. 3, masking material 18 (FIG. 2) is removed to leave mass 16 over material 14. Mass 16 has a thickness "X", and such thickness can be, for example, at least 250 angstroms; in particular applications at least 300 angstroms, and even at least 320 angstroms.

Opening 20 has a depth "D" within insulative material 14 and a width "W". An exemplary depth can be, for example, about 2 microns, and an exemplary width can be, for example, about 0.3 microns. Further, opening 20 can, in particular applications, comprise a circular periphery, such that the width is a diameter of the circle.

In particular aspects of the invention, material 14 can be considered a first mass, coating 16 a second mass, and substrate 12 a third mass. Accordingly, opening 20 can be considered to extend through first and second masses 14 and 16, and to terminate proximate surface 15 of third mass 12. Alternatively, masses 12, 14 and 16 can be considered a first material, second material and third material, respectively; and opening 20 can be considered to extend through second and third materials 14 and 16, and to terminate proximate surface 15 of first material 12.

Wafer 10 is subsequently exposed to etching conditions which remove a substantial portion of material 16 from over mass 14. In particular embodiments, an entirety of material 16 is removed to form the resulting structure shown in FIG. 4. The etching conditions preferably comprise reactive ion etching conditions in which exposed surfaces of wafer 10 are subjected to a gas having components therein which are reactive with material 16. The components can also be reactive with exposed portions of materials 12 and 14. In particular applications, the reactive components can comprise fluorine-containing molecules, such as, for example, $NF_3$. A total concentration of the reactive components within the gas utilized for reactive etching of material 16 is preferably less than 4.5%, by volume; more preferably less than 2%, by volume; and even more preferably less than 1%, by volume.

The reactive ion etching of material 16 will typically occur within a reactive ion etch plasma reactor, and preferably a pressure within the reactor to which wafer 10 is exposed during etching of material 16 will be from about 300 mTorr to about 1000 mTorr. Further, wafer 10 will preferably be subjected to a bias of from about 50 watts to about 2000 watts in the reactive ion etch plasma reactor during etching of material 16, and can be subjected to an exemplary bias of from about 50 watts to about 500 watts, or from about 350 watts to about 400 watts. A suitable reactor is the Iridia™ reactor marketed by Novellus Systems, Inc.

The above-described etching conditions are substantially different than the conditions typically utilized within a reactive ion etch reactor. Specifically, etching within reactive ion reactors would typically be conducted at a pressure of less than 200 mTorr, and with a reactive gas concentration of from about 5% to about 100%, by volume. However, the typical reactive ion etch will remove large amounts of material from exposed surfaces within an opening (such as opening 20), as well as from exposed upper surfaces of wafer 10. In contrast, methodology of the present invention can substantially selectively remove material 16 from exposed upper surfaces of wafer 10, while not removing material from within opening 20. More specifically, methodology of the present invention can remove at least 250 angstroms of material 16 from over mass 14 while extending the depth "D" of opening 20 by no more than 50 angstroms. In particular embodiments, at least 300 angstroms of material 16 can be removed from over mass 14, or least 320 angstroms of material 16 can be removed from over mass 14, while not extending the depth "D" of opening 20 by more than 50 angstroms; and in further embodiments an entirety of material 16 can be removed from over mass 14 while not extending the depth "D" of opening 20 by more than 50 angstroms.

It is noted that bottom periphery 24 is exposed to the etching conditions utilized to remove material 16 during the etch of material 16, but the low concentration of reactive components of the etching gas, and the high pressure within the reactor, together result in material 16 being removed much more rapidly than is material within opening 20. The selectivity for material 16 can be enhanced by utilizing openings 20 having a high critical dimension, and accordingly methodology of the present invention can work particularly well for openings having an aspect ratio of at least about 3, even better if the aspect ratio is at least about 6, better if the aspect ratio is at least about 6.5, and better yet if the aspect ratio is at least about 7.

It is found that a suitable exposure time for removing 325 angstroms of material 16 from over mass 14 is from about 60 seconds to about 3 minutes in applications in which material 16 comprises silicon oxynitride and mass 14 comprises BPSG. Also, it is found that less than 50 angstroms of material will be etched from a monocrystalline substrate 12 exposed at a bottom of an opening 20 having a width "W" of 0.3 microns, and a depth "D" of about 2 microns during such exposure time and under preferred exposure conditions of the present invention. In a particular embodiment, the initial width "W" of opening 20 is 0.3 microns, the initial depth "D" is 2 microns, and 320 angstroms of material 16 is removed from over mass 14 while extending depth "D" by only from about 0.005 microns to about 0.007 microns into a monocrystalline silicon substrate 12.

A further advantage of methodology of the present invention is that such can avoid increasing width "W" by any significant amount during the removal of material 16. In particular embodiments, etching conditions of the present invention can remove at least 250 angstroms of thickness "X" of material 16 (FIG. 3) from over mass 14 and yet extend the width "W" of the opening by no more than about 0.010 microns. In particular embodiments, the thickness "X" is reduced by at least about 300 angstroms, or at least about 320 angstroms, and yet the width "W" of opening 20 is not extended by more than 0.010 microns (100 angstroms). In particular aspects of the invention, the width is extend by from about 5 nanometers to about 7 nanometers.

Exemplary processes of the present invention include applications other than those discussed above. For instance, in particular aspects the invention includes methods in which a top surface treatment is utilized at relatively high pressures (at least about 300 mTorr, and in particular applications at least about 1000 mTorr, and in further applications from about 300 mTorr to about 4000 mTorr) and low reactive gas concentrations (less than 4.5% by volume, more preferably less than 2% by volume, and even more preferably less than 1% by volume) to accomplish spot planarization across a surface of a semiconductor substrate. Specifically, it is found that the combination of high pressure and low reactive gas concentrations can remove peaks and valleys from across a semiconductor substrate to planarize the surface. In a particular application, a layer of in situ p-type doped polycrystalline silicon (polysilicon) is exposed to a reactive gas comprising $O_2$ and a low concentration of $CF_4$, at a pressure of about 1000 mTorr, to reduce a thickness of the polysilicon from 2200 Å to 1600 Å. Microwave power utilized in the etch is 1500 W. The etching not only reduces the thickness of the polysilicon, but also removes surface defects, and specifically can remove dimples that are 800 Å deep in the initial (2200 Å thick) polysilicon. The etching can occur with little or no power bias (e.g., radiofrequency bias) in order to be relatively isotropic.

Particular aspects of the present invention can resemble prior art cleaning procedures. A distinction between etching of the particular aspects of the present invention and the prior art cleaning procedures is that typically only some of a material is removed in the etches, whereas all of a material is typically removed in a cleaning procedure.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method, comprising:
   providing a semiconductor substrate having a first mass, and a second mass over the first mass;
   forming a patterned layer of photoresist over the second mass, the patterned layer of photoresist having an opening provided therethrough;
   while the photoresist is over the second mass, extending the opening through the second mass and into the first mass; the second mass having a thickness and the extended opening having a depth; the second mass comprising silicon, oxygen and nitrogen;
   removing the photoresist from over the second mass; and
   after removing the photoresist and while a bottom periphery of the opening is exposed, subjecting the substrate to etching conditions which remove at least 250 Å from the thickness of the second mass and which extend the depth of the opening by no more than 50Å; wherein the etching conditions comprise subjecting exposed surfaces of the substrate to a gas having components therein which are reactive with the first mass, and wherein a total concentration of such components within the gas is less than 4.5%, by volume.

2. The semiconductor processing method of claim 1 wherein the total concentration of the components is less than 2%, by volume.

3. The semiconductor processing method of claim 1 wherein the total concentration of the components is less than 1%, by volume.

4. The semiconductor processing method of claim 1 wherein the components include fluorine-containing molecules.

5. The semiconductor processing method of claim 1 wherein the components include $NF_3$.

6. The semiconductor processing method of claim 1 wherein the etching conditions comprise exposing the substrate to a bias of from about 50 watts to about 500 watts in a reactive ion etch plasma reactor, while maintaining a pressure within the reactor at from about 300 mTorr to about 1,000 mTorr.

7. The semiconductor processing method of claim 6 wherein the bias is from about 350 watts to about 400 watts.

8. The semiconductor processing method of claim 1 wherein the opening has an aspect ratio of at least about 3.

9. The semiconductor processing method of claim 1 wherein the opening has an aspect ratio of at least about 6.

10. The semiconductor processing method of claim 1 wherein the opening has an aspect ratio of at least about 6.5.

11. The semiconductor processing method of claim 1 wherein the opening has an aspect ratio of at least about 7.

12. The semiconductor processing method of claim 1 wherein the exposure to the etching conditions removes at least 300 Å from the thickness of the second mass.

13. The semiconductor processing method of claim 1 wherein the exposure to the etching conditions removes at least 320 Å from the thickness of the second mass.

14. The semiconductor processing method of claim 1 wherein the second mass is substantially entirely removed from over the first mass during the exposure to the etching conditions.

15. The semiconductor processing method of claim 1 wherein the opening extends through the second mass and terminates proximate or within a third mass prior to the exposing to the etching conditions.

16. The semiconductor processing method of claim 15 wherein the first mass comprises borophosphosilicate glass, the second mass comprises an antireflective coating, and the third mass comprises silicon.

17. The semiconductor processing method of claim 15 wherein the first mass comprises borophosphosilicate glass, the second mass comprises DARC, and the third mass comprises silicon.

18. The semiconductor processing method of claim 15 wherein the first mass comprises borophosphosilicate glass, the second mass comprises silicon oxynitride, and the third mass comprises silicon.

19. The semiconductor processing method of claim 18 wherein the third mass comprises monocrystalline silicon.

20. A semiconductor processing method, comprising:
    providing a semiconductor substrate having a first mass, and a second mass over the first mass;
    forming a patterned layer of photoresist over the second mass, the patterned layer of photoresist having an opening provided therethrough;
    while the photoresist is over the second mass, extending the opening through the second mass and into the first mass; the second mass having a thickness and the extended opening having a width; the second mass comprising silicon, oxygen and nitrogen;
    removing the photoresist from over the second mass; and
    after removing the photoresist and without providing a protective material over a bottom periphery of the opening, subjecting the substrate to etching conditions which remove at least 250 Å from the thickness of the second mass and which extend the width of the opening by no more than about 100 Å; wherein the etching conditions comprise subjecting exposed surfaces of the substrate to a gas having components therein which are reactive with the first mass, and wherein a total concentration of such components within the gas is less than 4.5%, by volume.

21. The semiconductor processing method of claim 20 wherein the total concentration of the components is less than 2%, by volume.

22. The semiconductor processing method of claim 20 wherein the total concentration of the components is less than 1%, by volume.

23. The semiconductor processing method of claim 20 wherein the components include fluorine-containing molecules.

24. The semiconductor processing method of claim 20 wherein the components include $NF_3$.

25. The semiconductor processing method of claim 20 wherein the etching conditions comprise exposing the substrate to a bias of from about 50 watts to about 2000 watts in a reactive ion etch plasma reactor, while maintaining a pressure within the reactor at from about 300 mTorr to about 4,000 mTorr.

26. The semiconductor processing method of claim 25 wherein the bias is from about 350 watts to about 400 watts.

27. The semiconductor processing method of claim 20 wherein the opening has an aspect ratio of at least about 3.

28. The semiconductor processing method of claim 20 wherein the opening has an aspect ratio of at least about 6.

29. The semiconductor processing method of claim 20 wherein the opening has an aspect ratio of at least about 6.5.

30. The semiconductor processing method of claim 20 wherein the opening has an aspect ratio of at least about 7.

31. The semiconductor processing method of claim 20 wherein the exposure to the etching conditions removes at least 300 Å from the thickness of the second mass.

32. The semiconductor processing method of claim 20 wherein the exposure to the etching conditions removes at least 320 Å from the thickness of the second mass.

33. The semiconductor processing method of claim 20 wherein the second mass is substantially entirely removed from over the first mass during the exposure to the etching conditions; and wherein the exposure to the etching conditions.

34. The semiconductor processing method of claim 20 wherein the exposing to the etching conditions extends the width of the opening by no more than 50 Å.

35. The semiconductor processing method of claim 20 wherein the exposing to the etching conditions extends the width of the opening by no more than 10 Å.

36. The semiconductor processing method of claim 20 wherein the exposing to the etching conditions extends a depth of the opening by no more than 50 Å.

37. The semiconductor processing method of claim 36 wherein the opening extends through the second mass and terminates proximate or within a third mass prior to the exposing to the etching conditions which extend the depth of the opening by no more than 50 Å.

38. The semiconductor processing method of claim 37 wherein the first mass comprises borophosphosilicate glass, the second mass comprises silicon oxynitride, and the third mass comprises silicon.

39. The semiconductor processing method of claim 37 wherein the third mass comprises monocrystalline silicon.

* * * * *

UNITED STATES PATENT AND TRADEMARK OFFICE
CERTIFICATE OF CORRECTION

PATENT NO. : 6,576,557 B1
DATED : June 10, 2003
INVENTOR(S) : Kevin J. Torek et al.

It is certified that error appears in the above-identified patent and that said Letters Patent is hereby corrected as shown below:

Column 3,
Line 9, replace "and specifically will preferably will comprise an aspect ratio" with
-- and specifically will preferably comprise an aspect ratio --

Column 8,
Lines 9-11, replace "the exposure to the etching conditions; and wherein the exposure to the etching condi-tions." with -- the exposure to the etching conditions. --

Signed and Sealed this

Seventh Day of October, 2003

JAMES E. ROGAN
*Director of the United States Patent and Trademark Office*